United States Patent
Yamashita et al.

(10) Patent No.: US 10,913,132 B2
(45) Date of Patent: Feb. 9, 2021

(54) SOLDER COMPOSITION, ELECTRONIC BOARD, AND BONDING METHOD

(71) Applicant: TAMURA CORPORATION, Tokyo (JP)

(72) Inventors: Nobuhiro Yamashita, Iruma (JP); Jun Aoki, Iruma (JP); Shinichi Usukura, Iruma (JP); Satoshi Okumura, Iruma (JP)

(73) Assignee: TAMURA CORPORATION, Tokyo (JP)

( * ) Notice: Subject to any disclaimer, the term of this patent is extended or adjusted under 35 U.S.C. 154(b) by 130 days.

(21) Appl. No.: 16/114,640

(22) Filed: Aug. 28, 2018

(65) Prior Publication Data

US 2019/0061070 A1    Feb. 28, 2019

(30) Foreign Application Priority Data

Aug. 30, 2017  (JP) ................................. 2017-165505
Aug. 6, 2018   (JP) ................................. 2018-147523

(51) Int. Cl.
| | | |
|---|---|---|
| *B23K 35/362* | (2006.01) | |
| *H05K 3/34* | (2006.01) | |
| *B23K 35/36* | (2006.01) | |
| *B23K 35/02* | (2006.01) | |
| *B23K 101/42* | (2006.01) | |

(52) U.S. Cl.
CPC ........ *B23K 35/362* (2013.01); *B23K 35/0244* (2013.01); *B23K 35/3613* (2013.01); *B23K 35/3616* (2013.01); *H05K 3/3463* (2013.01); *H05K 3/3489* (2013.01); *B23K 2101/42* (2018.08); *H05K 3/3436* (2013.01)

(58) Field of Classification Search
CPC ........................... B23K 35/362; H05K 3/3489
USPC ......................................................... 148/23
See application file for complete search history.

(56) References Cited

U.S. PATENT DOCUMENTS

2016/0316572 A1    10/2016   Nachreiner et al.

FOREIGN PATENT DOCUMENTS

| CN | 104416297 A | * | 3/2015 |
|---|---|---|---|
| CN | 104416297 A | | 3/2015 |
| CN | 105855749 A | | 8/2016 |
| JP | 2-25291 | | 1/1990 |
| JP | 2013193097 A | * | 9/2013 |
| JP | 5756067 | | 6/2015 |
| JP | 2015-123491 A | | 7/2015 |
| JP | 2015123491 A | * | 7/2015 |
| JP | 2015-142936 A | | 8/2015 |
| JP | 2017-507025 A | | 3/2017 |
| JP | 2017-064758 A | | 4/2017 |
| JP | 2017-064761 A | | 4/2017 |
| JP | 2018-161674 A | | 10/2018 |
| WO | 2010/113833 A1 | | 10/2010 |

OTHER PUBLICATIONS

Japanese Office Action with English translation dated Jul. 23, 2019, 4 pages.
Japanese Notice of Allowance dated Mar. 3, 2020, Application No. JP 2018-147523; with partial English translation, 4 pages.

* cited by examiner

*Primary Examiner* — Weiping Zhu

(74) *Attorney, Agent, or Firm* — Rankin, Hill & Clark LLP

(57) ABSTRACT

A solder composition contains: flux composition containing (A) rosin-based resin, (B) activator, and (C) solvent; and (D): solder powder with a melting point of 200 to 250 degrees C. The component (A) contains (A1) rosin-based resin with a softening point of 120 degrees C. or more and an acid number of 220 mgKOH/g or more and (A2) rosin-based resin with a softening point of 100 degrees C. or less and an acid number of 20 mgKOH/g or less. The component (C) contains (C1) hexanediol solvent with a melting point of 40 degrees C. or more and a boiling point of 220 degrees C. or less and (C2) solvent with a viscosity of 10 mPa·s or less at 20 degrees C. and a boiling point of 270 degrees C. or more. A content of the component (A1) ranges from 15 to 25 mass % with respect to the flux composition (100 mass %).

20 Claims, 2 Drawing Sheets

SOLDER COMPOSITION, ELECTRONIC BOARD, AND BONDING METHOD

The entire disclosure of Japanese Patent Applications No. 2017-165505 filed Aug. 30, 2017 and No. 2018-147523 filed Aug. 6, 2018 is expressly incorporated by reference herein.

TECHNICAL FIELD

The present invention relates to a solder composition and an electronic board.

BACKGROUND ART

A solder composition is a mixture in paste form produced by kneading a solder powder and a flux composition, which includes a rosin-based resin, an activator and a solvent (see Patent Literature 1: Japanese Patent Publication No. 5756067). The solder composition is required to exhibit properties such as solderability, void-inhibiting property and printability, the solderability including solder meltability and tendency to be wet-spread (i.e., solder wet-spreadability).

As an example of the solder composition, a so-called no-wash solder composition with a remaining flux residue is widely used. The solder composition is usable for bonding a printed wiring board and an electronic component, the printed wiring board including a base such as a glass-epoxy base, a paper-epoxy base, a paper-phenolic base, and a plastic base.

For instance, it has been found that bubbles remain in a flux residue, for instance, when the solder composition is applied to the paper phenolic base. The bubbles remaining in the flux residue may contain moisture and/or be cracked, thus lowering insulation reliability.

SUMMARY OF THE INVENTION

In view of the above, an object of the invention is to provide a solder composition capable of sufficiently reducing bubbles in a flux residue and an electronic board where the solder composition is applied.

To solve the above problem, the present invention provides a solder composition and an electronic board described hereinbelow.

According to an aspect of the invention, a solder composition contains: a flux composition containing a component (A) in a form of a rosin-based resin, a component (B) in a form of an activator, and a component (C) in a form of a solvent; and a component (D) in a form of a solder powder with a melting point in a range from 200 degrees C. to 250 degrees C. The component (A) contains a component (A1) in a form of a rosin-based resin with a softening point of 120 degrees C. or more and an acid number of 220 mgKOH/g or more and a component (A2) in a form of a rosin-based resin with a softening point of 100 degrees C. or less and an acid number of 20 mgKOH/g or less, the component (C) contains a component (C1) in a form of a hexanediol solvent with a melting point of 40 degrees C. or more and a component (C2) in a form of a solvent with a viscosity of 10 mPa·s or less at 20 degrees C. and a boiling point of 270 degrees C. or more, and a content of the component (A1) is in a range from 15 mass % to 25 mass % with respect to the flux composition being 100 mass %.

In the above aspect, it is preferable that the component (C1) is at least one selected from the group consisting of 2,5-dimethylhexane-2,5-diol and 1,6-hexanediol.

In the above aspect, it is preferable that the component (C2) is tetraethylene glycol dimethyl ether.

In the above aspect, it is preferable that the solder composition is used to connect an electronic board including a paper phenolic base to an electronic component.

According to another aspect of the invention, an electronic board includes a soldered portion where the solder composition is applied.

A mechanism by which the solder composition of the above aspect can sufficiently reduce bubbles in the flux residue has not been fully revealed but the inventors speculate the mechanism as follows.

The solder composition of the above aspect contains the component (C), i.e., the solvent, which contains a combination of the component (C1): the hexanediol solvent with a melting point of 40 degrees C. or more and the component (C2): the solvent with a viscosity of 10 mPa·s or less at 20 degrees C. and a boiling point of 270 degrees C. or more. The component (C1), which has a relatively low boiling point, is vaporized into a gas before or during the melting of the solder. The vaporized gas allows for expelling gas in the flux residue outside. In contrast, the component (C2), which has a high boiling point, is hardly vaporized even during the melting of the solder. The component (C2) can thus reduce generation of bubbles resulting from the vaporization of the solvent. Further, since the flux residue containing the component (C2) exhibits some fluidity even during a reflow process, the gas in the flux residue gradually comes together to be discharged outside. Bubbles in the flux residue can thus be sufficiently reduced.

The component (A), i.e., the rosin-based resin, for the solder composition of the above aspect contains a combination of the component (A1): the rosin-based resin with a softening point of 120 degrees C. or more and an acid number of 220 mgKOH/g or more and the component (A2): the rosin-based resin with a softening point of 100 degrees C. or less and an acid number of 20 mgKOH/g or less. Further, a content of the component (A1) is regulated within a predetermined range. The inventors have found that when the solder composition contains the solvent containing the component (C1) and the component (C2), bubbles are more likely to be generated in the flux residue with an increase in the content of the component (A1). A mechanism for the above has not been fully revealed. However, the inventors speculate that a carboxylic acid component in the component (A1), which has a high acid number, is likely to be decomposed into a gas of the carboxylic acid component, causing bubbles in the flux residue. In the solder composition of the above aspect, the content of the component (A1) is regulated to reduce the generation of bubbles in the flux residue. Further, the component (A), i.e., the rosin-based resin, contains the component (A2) in combination with the component (A1) to improve the fluidity of the flux residue so that bubbles in the flux residue are likely to be discharged outside. In addition, the component (A2) compensates physical properties required of a rosin-based resin (e.g., a solder meltability for a reflow process in the atmosphere).

The inventors thus speculate that the above aspect(s) of the invention can achieve the effects.

According to the above aspect(s) of the invention, it is possible to provide a solder composition capable of sufficiently reducing bubbles in a flux residue and an electronic board where the solder composition is applied.

BRIEF DESCRIPTION OF DRAWING(S)

DESCRIPTION OF EMBODIMENT(S)

Figure 1:
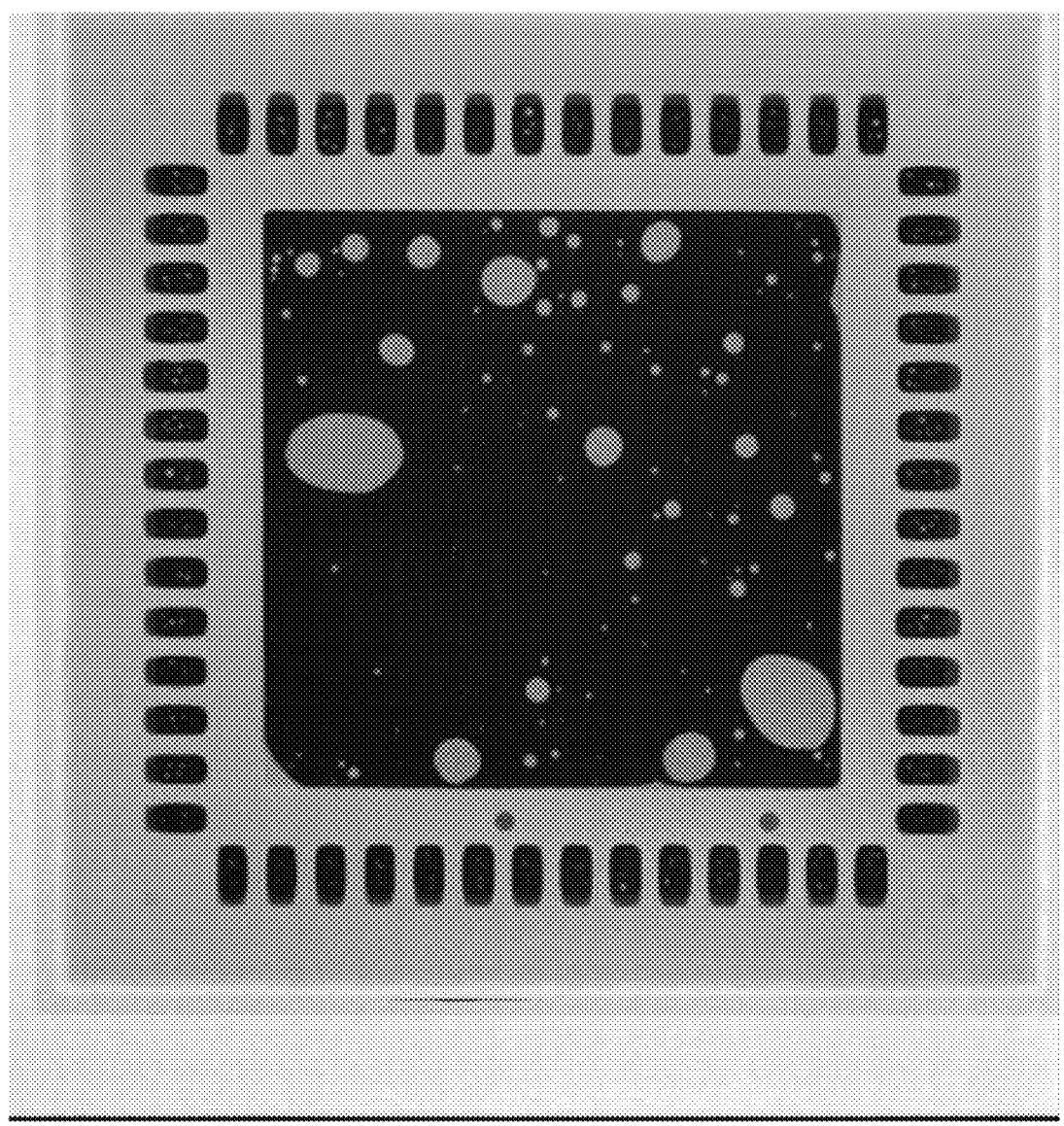
FIG. 1 is a photograph showing an image of a solder joint (QFN part) on a sample board of Example 1 observed using an X-ray inspection machine.

A solder composition of an exemplary embodiment of the invention contains a flux composition and a component (D) in a form of a solder powder, which will be described hereinbelow.

Flux Composition

Initially, a flux composition for the exemplary embodiment will be described. The flux composition for the exemplary embodiment, which is a component other than a solder powder in a solder composition, contains a component (A) in a form of a rosin-based resin, a component (B) in a form of an activator, and a component (C) in a form of a solvent.

Component (A)

Examples of the component (A) in a form of the rosin-based resin for the exemplary embodiment include rosins and rosin-based modified resins. Examples of the rosins include gum rosin, wood rosin and tall oil rosin. Examples of the rosin-based modified resins include: a disproportionated rosin, a polymerized rosin, a hydrogenated rosin, and derivatives of these rosins, the hydrogenated rosin including a fully hydrogenated rosin, a partially hydrogenated rosin, and a hydrogenated substance of an unsaturated organic-acid-modified rosin (occasionally referred to as "hydrogenated-acid-modified rosin"), which is a modified rosin of an unsaturated organic acid such as an aliphatic unsaturated monobasic acid (e.g., (meth)acrylic acid), an aliphatic unsaturated dibasic acid (e.g., α,β-unsaturated carboxylic acid such as fumaric acid and maleic acid), and an aromatic-ring-containing unsaturated carboxylic acid (e.g., cinnamic acid). These rosin-based resins can be employed singly or in combination of two or more kinds thereof.

In the exemplary embodiment, the component (A) is required to contain a component (A1): a rosin-based resin with a softening point of 120 degrees C. or more and an acid number of 220 mgKOH/g or more and a component (A2): rosin-based resin with a softening point of 100 degrees C. or less and an acid number of 20 mgKOH/g or less. It should be noted that an acid number (average acid number) can be measured by determining an amount of potassium hydroxide necessary for neutralizing a free fatty acid contained in a sample of 1 g. Meanwhile, a softening point can be measured by a ring-and-ball method.

Examples of the component (A1) include, among the above examples of the component (A), rosin-based resins with a softening point of 120 degrees C. or more and an acid number of 220 mgKOH/g or more. In terms of the fluidity of the flux composition, the softening point of the component (A1) is preferably 130 degrees C. or more. Further, in terms of activation effect, the acid number of the component (A1) is preferably 230 mgKOH/g or more. It should be noted that respective upper limits of the softening point and the acid number of the component (A1) are not limited. For instance, the softening point of the component (A1) may be 200 degrees C. or less. The acid number of the component (A1) may be 500 mgKOH/g or less.

Examples of the component (A2) include, among the above examples of the component (A), rosin-based resins with a softening point of 100 degrees C. or less and an acid number of 20 mgKOH/g or less. In order to reduce bubbles in the flux residue, the softening point of the component (A2) is preferably 90 degrees C. or less, more preferably in a range from 70 degrees C. to 90 degrees C. In order to reduce bubbles in the flux residue, the acid number of the component (A2) is preferably 15 mgKOH/g or less, more preferably in a range from 3 mgKOH/g to 15 mgKOH/g.

It should be noted that the softening point of the component (A) may be adjusted by: (i) adjusting the degree of rosin polymerization (the softening point tends to be raised with an increase in the degree of rosin polymerization); (ii) changing a method for modifying the rosin (the softening point tends to be raised by modifying the rosin with, for instance, acrylic acid or maleic acid); (iii) adjusting a molecular weight of the rosin (the softening point tends to be raised with an increase in the molecular weight); (iv) hydrogenating the rosin; or (v) esterifying or transesterifying the rosin.

The acid number of the component (A) may be adjusted by changing a method for modifying the rosin (for instance, the acid number tends to be increased by modifying the rosin with acrylic acid or maleic acid and reduced by esterifying the rosin).

In the exemplary embodiment, a content of the component (A1) is required to fall within a range from 15 mass % to 25 mass % with respect to the flux composition being 100 mass %. At a content of less than 15 mass %, the solder meltability becomes insufficient. Meanwhile, at a content exceeding 25 mass %, bubbles in the flux residue cannot be reduced. In order to further reduce bubbles in the flux residue, the content of the component (A1) preferably falls within a range from 15 mass % to 22 mass %, more preferably from 17 mass % to 20 mass %.

In the exemplary embodiment, in terms of, for instance, a balance between solder meltability and printability, a content of the component (A2) preferably falls within a range from 15 mass % to 30 mass %, more preferably from 17 mass % to 28 mass %, particularly preferably from 17 mass % to 25 mass % with respect to the flux composition being 100 mass %.

In the exemplary embodiment, in order to further reduce bubbles in the flux residue, a mass ratio (A1/A2) of the component (A1) to the component (A2) preferably falls within a range from 1/3 to 2/1, more preferably from 2/3 to 3/2, particularly preferably from 3/4 to 1/1.

Further, the component (A) may contain another rosin-based resin (component (A3)) in addition to the component (A1) and the component (A2) as needed. In this case, a mass ratio of the component (A1) and the component (A2) in total to the component (A), which is represented by [{(A1)+(A2)}/(A)×100], is preferably 80 mass % or more, more preferably 90 mass % or more, particularly preferably 95 mass % or more.

A content of the component (A) preferably falls within a range from 20 mass % to 60 mass %, more preferably from 25 mass % to 50 mass %, particularly preferably from 30 mass % to 45 mass % with respect to the flux composition being 100 mass %. At a content of the component (A) of the above lower limit or more, so-called solderbility (a property of preventing oxidation of a copper-foil surface of a soldering land so that molten solder easily gets wet on the copper-foil surface) can be improved to sufficiently reduce solder beads. Meanwhile, at a content of the component (A) of the above upper limit or less, an amount of the flux residue can be sufficiently reduced.

Component (B)

Examples of the component (B) in a form of the activator for the exemplary embodiment include an organic acid, a non-dissociative activator produced from a non-dissociative halogenated compound, and an amine activator. The above activators may be employed singly or in combination of two or more kinds thereof. Among the above, in terms of environmental protection and/or reduction in corrosion of a soldered portion, the organic acid and the amine activator (halogen free) are preferably usable and the organic acid is more preferably usable.

Examples of the organic acid include a monocarboxylic acid, dicarboxylic acid, and other organic acids.

Examples of the monocarboxylic acid include formic acid, acetic acid, proprionic acid, butyric acid, valeric acid, caproic acid, enanthic acid, capric acid, lauryl acid, myristic acid, pentadecyl acid, palmitin acid, margaric acid, stearic acid, tuberculostearic acid, arachidic acid, behenic acid, lignoceric acid, and glycolic acid.

Examples of the dicarboxylic acid include oxalic acid, malonic acid, succinic acid, glutaric acid, adipic acid, pimelic acid, suberic acid, azelaic acid, sebacic acid, fumaric acid, maleic acid, tartaric acid, and diglycolic acid.

Examples of other organic acids include dimer acid, levulinic acid, lactic acid, acrylic acid, benzoic acid, salicylic acid, anisic acid, citric acid, and picolinic acid.

Examples of the non-dissociative activator include a non-salt organic compound to which a halogen atom is bonded through a covalent bond. The halogenated compound may be a compound in which chlorine atom(s), bromine atom(s) or fluorine atom(s) is singly included through a covalent bond (e.g., a chloride, bromide and fluoride). Alternatively, the halogenated compound may be a compound in which any two or all of atoms selected from chlorine atom(s), bromine atom(s) and fluorine atom(s) are included through a covalent bond. It is preferable, in order to improve the solubility to an aqueous solvent, that the halogenated compound has a polar group such as hydroxyl group and carboxyl group as in the case of halogenated alcohol or halogenated carboxyl compound. Examples of the halogenated alcohol include: brominated alcohol such as 2,3-dibromopropanol, 2,3-dibromobutanediol, trans-2,3-dibromo-2-butene-1,4-diol, 1,4-dibromo-2-butanol and tribromoneopentylalcohol; chlorinated alcohol such as 1,3-dichloro-2-propanol and 1,4-dichloro-2-butanol; fluorinated alcohol such as 3-fluorocatechol; and other compounds equivalent to the above. Examples of the halogenated carboxyl compound include: a carboxyl iodide compound such as 2-iodobenzoic acid, 3-iodobenzoic acid, 2-iodopropionic acid, 5-iodosalicylic acid and 5-iodoanthranilic acid; carboxyl chloride compound such as 2-chlorobenzoic acid and 3-chloropropionic acid; a brominated carboxyl compound such as 2,3-dibromopropionic acid, 2,3-dibromosuccinic acid and 2-bromobenzoic acid; and other compounds equivalent to the above.

Examples of the amine activator include: amines such as polyamine (e.g., ethylenediamine); amine salts such as organic acid salts or inorganic acid salts (e.g., hydrochloric acid, sulfuric acid and hydrobromic acid) of amines (e.g., trimethylolamine, cyclohexylamine and diethylamine) and amino alcohols; amino acids such as glycine, alanine, asparaginic acid, glutamic acid, and valine; and amide compounds. Specific examples of the amine activator include diphenyl guanidine hydrobromide, cyclohexyl amine hydrobromide, diethylamine salt (e.g., hydrochloride, succinate, adipate, and sebacate), triethanolamine, monoethanolamine, and hydrobromide of these amines.

A content of the component (B) preferably falls within a range from 1 mass % to 20 mass %, more preferably from 1 mass % to 15 mass %, particularly preferably from 2 mass % to 10 mass % with respect to the flux composition being 100 mass %. At a content of the component (B) of less than the above lower limit, solder beads are likely to be formed. Meanwhile, at a content of the component (B) exceeding the above upper limit, the insulation property of the flux composition tends to be lowered.

Component (C)

In the exemplary embodiment, the component (C) in a form of the solvent is required to contain a component (C1): a hexanediol solvent with a melting point of 40 degrees C. or more and a component (C2): a solvent with a viscosity of 10 mPa·s or less at 20 degrees C. and a boiling point of 270 degrees C. or more. A combination of the component (C1) and the component (C2) allows for reducing bubbles in the flux residue and, further, reducing voids.

It should be noted that upper limit of the melting point of the component (C1) is not limited. For instance, the melting point of the component (C1) may be 100 degrees C. or less. Similarly, the lower limit of the boiling point of the component (C1) is not limited. For instance, the boiling point of the component (C1) may be 120 degrees C. or more. It should be noted that the "boiling point" herein means a boiling point at 1013 hPa.

Examples of the component (C1) include 2,5-dimethyl-2,5-hexanediol (melting point: 86 to 90 degrees C., boiling point: 214 degrees C.), 1,6-hexanediol (melting point: 40 to 44 degrees C., boiling point: 250 degrees C.), and (2S,5S)-2,5-hexanediol (melting point: 52 to 56 degrees C., boiling point: 212 to 215 degrees C.). Among the above, 2,5-dimethyl-2,5-hexanediol is more preferable in terms of the melting point of the solvent. The above substances may be employed singly or in combination of two or more kinds thereof.

Additionally, in order to further reduce bubbles in the flux residue, the viscosity of the component (C2) at 20 degrees C. is more preferably 8 mPa·s or less, particularly preferably 5 mPa·s or less, most preferably 2 mPa·s or less. The lower limit of the viscosity of the component (C2) at 20 degrees C. is not limited. For instance, the viscosity of the component (C2) at 20 degrees C. may be 0.01 mPa·s or more. it should be noted that the viscosity of the solvent can be measured using a Brookfield rotational viscometer.

Additionally, in order to further reduce bubbles in the flux residue, the boiling point of the component (C2) more preferably falls within a range from 275 degrees C. to 300 degrees C.

Examples of the component (C2) include tetraethylene glycol dimethyl ether (boiling point: 275 degrees C., viscosity: 3.8 mPa·s), tripropylene glycol monobutyl ether (boiling point: 274 degrees C., viscosity: 8.4 mPa·s), and maleic acid dibutyl (boiling point: 281 degrees C., viscosity: 5.0 mPa·s). Among the above, tetraethylene glycol dimethyl ether is more preferable in terms of the viscosity of the solvent. The above substances may be employed singly or in combination of two or more kinds thereof. It should be that the "viscosity" in the above parentheses means a viscosity at 20 degrees C.

A mass ratio ((C2)/(C1)) of the component (C2) to the component (C1) preferably falls within a range from 1 to 10, more preferably from 3/2 to 8, particularly preferably from 2 to 6 in terms of reduction of bubbles in the flux residue and printability.

The component (C) may also contain another solvent (component (C3)) in addition to the component (C1) and the component (C2) as long as an object of the invention is achievable. The component (C3) is effective in dissolving or dispersing a solid content of the solder composition. The component (C3) is preferably in a liquid form at 20 degrees C.

Examples of the component (C3) include diethylene glycol monohexyl ether (boiling point: 259 degrees C., viscosity: 8.6 mPa·s), diethylene glycol monobutyl ether (boiling point: 230 degrees C., viscosity: 6.6 mPa·s), α,β,γ-terpineol (boiling point: 217 degrees C., viscosity: 67 mPa·s), benzyl glycol (boiling point: 256 degrees C., viscosity: 12.6 mPa·s), diethylene glycol mono 2-ethylhexyl ether (boiling point: 272 degrees C., viscosity: 10.4 mPa·s), tripropylene glycol (boiling point: 265 degrees C., viscosity: 57.2 mPa·s), diethylene glycol monobenzyl ether (boiling point: 302 degrees C., viscosity: 19.3 mPa·s), diethylene glycol dibutyl ether (boiling point: 255 degrees C., viscosity: 2.4 mPa·s), tripropylene glycol monomethyl ether (boiling point: 242 degrees C., viscosity: 1 mPa·s), dipropylene glycol monobutyl ether (boiling point: 231 degrees C., viscosity: 7.4 mPa·s), ethylene glycol mono 2-ethylhexyl ether (boiling point: 229 degrees C., viscosity: 7.6 mPa·s), diethylene glycol monoethyl ether acetate (boiling point: 220 degrees C., viscosity: 2.8 mPa·s), and 2,2-dimethyl-1,3-propanediol (melting point: 127 to 130 degrees C., boiling point: 210 degrees C.). The above substances may be employed singly or in combination of two or more kinds thereof. It should be that the "viscosity" in the above parentheses means a viscosity at 20 degrees C.

In use of the component (C3), a mass ratio ((C3)/(C)) of the component (C3) to the component (C) is preferably in a range from 1/15 to 1/2, more preferably from 1/10 to 1/2, particularly preferably from 1/5 to 1/3 in terms of a balance of reduction of voids and printability.

A content of the component (C) preferably falls within a range from 20 mass % to 65 mass %, more preferably from 30 mass % to 60 mass %, particularly preferably from 40 mass % to 50 mass % with respect to the flux composition being 100 mass %. When the content of the solvent is in the above-described range, a viscosity of the obtained solder composition can be adjusted to fall within an appropriate range.

In the exemplary embodiment, a thixotropic agent may be further contained for printability. Examples of the thixotropic agent for the exemplary embodiment include hardened castor oil, amides, kaolin, colloidal silica, organic bentonite, and glass frit. The above thixotropic agents can be employed singly or in combination of two or more kinds thereof.

When the thixotropic agent is contained, a content of the thixotropic agent preferably falls within a range from 3 mass % to 20 mass %, more preferably from 5 mass % to 15 mass % with respect to the flux composition being 100 mass %. At a content of the thixotropic agent of less than the above lower limit, thixotropy cannot be exhibited, so that dripping is likely to occur. Meanwhile, at a content of the thixotropic agent exceeding the above upper, the thixotropy becomes too high, so that printing defect is likely to occur.

Other Components

In addition to the above-described component (A), component (B), component (C), and the thixotropic agent, other additives and/or other resins may be added to the flux composition for the exemplary embodiment as necessary. Examples of other additives include an antifoaming agent, an antioxidant, a modifier, a delustering agent, and a foaming agent. A content of the additive(s) preferably falls within a range from 0.01 mass % to 5 mass % with respect to the flux composition being 100 mass %. Examples of other resins include an acrylic resin.

Solder Composition

Next, the solder composition of the exemplary embodiment will be described. A solder composition of the exemplary embodiment includes the flux composition for the exemplary embodiment and the component (D) in a form of the solder powder as described below.

A content of the flux composition preferably falls within a range from 5 mass % to 35 mass %, more preferably from 7 mass % to 15 mass %, and particularly preferably from 8 mass % to 12 mass % with respect to the solder composition being 100 mass %. At a content of the flux composition of less than 5 mass % (i.e., at a content of the solder powder exceeding 95 mass %), the amount of the flux composition is insufficient as a binder, so that the flux composition is unlikely to easily mix with the solder powder. Meanwhile, at a content of the flux composition exceeding 35 mass % (i.e., at a content of the solder powder of less than 65 mass %), the resulting solder composition is unlikely to achieve desired solder joint.

Component (D)

The component (D), or the solder powder, for the exemplary embodiment is a solder powder with a melting point in a range from 200 degrees C. to 250 degrees C. In the exemplary embodiment, assuming that a solder powder with a melting point in a range from 200 degrees C. to 250 degrees C. is used, the respective boiling points of the component (C1) and the component (C2) are determined.

As a solder alloy for the solder powder, an alloy consisting mainly of tin (Sn) is preferably used. Further, examples of a secondary constituent of the alloy include silver (Ag), copper (Cu), zinc (Zn), bismuth (Bi), indium (In) and antimony (Sb). Further, other elements (i.e., tertiary and subsequent constituents) may be added to the alloy as necessary. Examples of other elements include copper, silver, bismuth, indium, antimony, and aluminum (Al).

Here, a "lead-free solder powder" means a powder of solder metal or alloy to which lead is not added. However, lead as an unavoidable impurity may be contained in the lead-free solder powder. In this case, an amount of the lead is preferably 300 mass ppm or less.

Specific examples of a solder alloy for the lead-free solder powder include Sn—Ag solder alloys and Sn—Ag—Cu solder alloys. Among the above, in terms of strength of the solder joint, the Sn—Ag—Cu solder alloys are preferably usable. The Sn—Ag—Cu solders usually have a melting point in a range from 200 degrees C. to 250 degrees C. (preferably from 200 degrees C. to 240 degrees C.). Incidentally, among the Sn—Ag—Cu solders, solders with a low silver content have a melting point in a range from 210 degrees C. to 250 degrees C. (preferably from 220 degrees C. to 240 degrees C.).

An average particle diameter of the component (D) is typically in a range from 1 μm to 40 μm. However, in terms of applicability to an electronic board with a narrow pitch between soldering pads, the average particle diameter of the component (D) is preferably in a range from 1 μm to 35 μm, more preferably in a range from 2 μm to 30 μm, and particularly preferably in a range from 3 μm to 20 μm. Incidentally, the average particle diameter can be measured with a particle-size measurement device using dynamic light scattering.

Production Method of Solder Composition

The solder composition of the exemplary embodiment can be produced by: blending the flux composition and the component (D) in a form of the solder powder at the above predetermined ratio; and stirring and mixing the blended material.

Electronic Board

Next, the electronic board of the exemplary embodiment will be described. The electronic board of the exemplary embodiment includes a soldered portion where the solder composition is applied. The electronic board of the exemplary embodiment can be produced by mounting an electronic component on an electronic substrate (e.g., printed circuit board) using the solder composition.

The solder composition of the exemplary embodiment allows for sufficient reduction of bubbles in the flux residue. In particular, even for an electronic board including a paper phenolic base, which is likely to have bubbles in the flux residue, the solder composition allows for sufficient reduction of bubbles in the flux residue.

Examples of a coating applicator to be used include a screen printer, a metal mask printer, a dispenser, and a jet dispenser.

The electronic component can be mounted on the electronic substrate by a reflow process, in which the electronic component is placed on the solder composition applied by the coating applicator and heated by a reflow furnace under predetermined conditions to mount the electronic component on the printed circuit board.

In the reflow process, the electronic component is placed on the solder composition and heated by the reflow furnace under the predetermined conditions. Through the reflow process, a desired solder joint can be achieved between the electronic component and the printed circuit board. As a result, the electronic component can be mounted on the printed circuit board.

The conditions for the reflow process may be suitably set depending on the melting point of the solder. For instance, a preheating temperature preferably falls within a range from 140 degrees C. to 200 degrees C., more preferably from 150 degrees C. to 160 degrees C. A preheating time preferably falls within a range from 60 seconds to 120 seconds. A peak temperature preferably falls within a range from 230 degrees C. to 270 degrees C., more preferably from 240 degrees C. to 255 degrees C. A retention time at a temperature of 220 degrees C. or more preferably falls within a range from 20 seconds to 60 seconds.

Incidentally, the solder composition and the electronic board of the exemplary embodiment are merely examples and thus may be modified and/or improved as long as an object of the invention is achievable.

For instance, the printed circuit board and the electronic component of the electronic board are exemplarily bonded through the reflow process. For example, in some exemplary embodiments, the printed circuit board and the electronic component are bonded by heating the solder composition using laser beam (i.e., laser heating process) instead of the reflow process. In this case, a laser beam source is not limited but any laser beam may be used depending on a wavelength corresponding to an absorption band of the metal. Examples of the laser beam source include a solid-state laser (e.g., ruby, glass and YAG), a semiconductor laser (e.g., GaAs and InGaAsP), a liquid laser (e.g., pigment), and a gas laser (e.g., He—Ne, Ar, $CO_2$ and excimer).

EXAMPLES

Next, the invention is further described in detail with reference to examples and comparatives but the scope of the invention is by no means limited by the examples and comparatives. Incidentally, materials used in the examples and comparatives are as follows.
Component (A1)
rosin-based resin A: hydrogenated-acid-modified rosin (softening point: 130 degrees C., acid number: 240 mgKOH/g), trade name "PINECRYSTAL KE-604", manufactured by Arakawa Chemical Industries, Ltd.
Component (A2)
rosin-based resin B: rosin ester (softening point: 80 degrees C. to 90 degrees C., acid number: 4 mgKOH/g to 12 mgKOH/g), trade name "HARITACK F85", manufactured by Harima Chemicals Group, Inc.
rosin-based resin C: rosin ester (softening point: 70 degrees C. to 80 degrees C., acid number: 10 mgKOH/g or less), trade name "SUPER ESTER A-75", manufactured by Arakawa Chemical Industries, Ltd.
Component (A3)
rosin-based resin D: hydrogenated rosin (softening point: 80 degrees C., acid number: 172 mgKOH/g), trade name "RHR-301", manufactured by MARUZEN CHEMICAL TRADING CO., LTD.
Component (B)
activator A: suberic acid
activator B: dibromobutenediol, manufactured by AR BROWN CO., LTD.
Component (C1)
solvent A: 2,5-dimethyl-2,5-hexanediol (melting point: 86 degrees C. to 90 degrees C., boiling point: 214 degrees C.)
solvent B: 1,6-hexanediol (melting point: 40 degrees C. to 44 degrees C., boiling point: 250 degrees C.)
Component (C2)
solvent C: tetraethylene glycol dimethyl ether (boiling point: 275 degrees C., viscosity: 3.8 mPa·s), trade name "HISOLVE MTEM", manufactured by TOHO Chemical Industry Co., Ltd.
Component (C3)
solvent D: diethylene glycol monohexyl ether (boiling point: 259 degrees C., viscosity: 8.6 mPa·s)
Component (D)
solder powder: alloy composition of Sn-3.0Ag-0.5Cu, particle size distribution of 20 μm to 38 μm, solder melting point of 217 degrees C. to 220 degrees C.
Other Components
thixotropic agent: hydrogenated castor oil, trade name "HIMAKOU", manufactured by KF TRADING CO., LTD.
antioxidant: trade name "IRGANOX 245", manufactured by BASF SE.

Example 1

A flux composition was prepared by mixing in a container the rosin-based resin A (17 mass %), the rosin-based resin B (17 mass %), the activator A (2 mass %), the activator B (2 mass %), the solvent A (10 mass %), the solvent C (26.5 mass %), the solvent D (15.5 mass %), the thixotropic agent (6 mass %), and the antioxidant (4 mass %) using a planetary mixer.

The obtained flux composition of 11 mass % and the solder powder of 89 mass % (100 mass % in total) were then put in a container and mixed using a planetary mixer to prepare a solder composition.

Examples 2 to 7

A solder composition was prepared in the same manner as in Example 1 except that materials were blended in accordance with the composition shown in Table 1.

Comparatives 1 to 6

A solder composition was prepared in the same manner as in Example 1 except that materials were blended in accordance with the composition shown in Table 1.

Evaluation of Solder Composition

Evaluation of the solder composition (void, solder meltability, and bubbles in the flux residue) was performed as follows. The obtained results are shown in Table 1.

(1) Void

Figure 2:
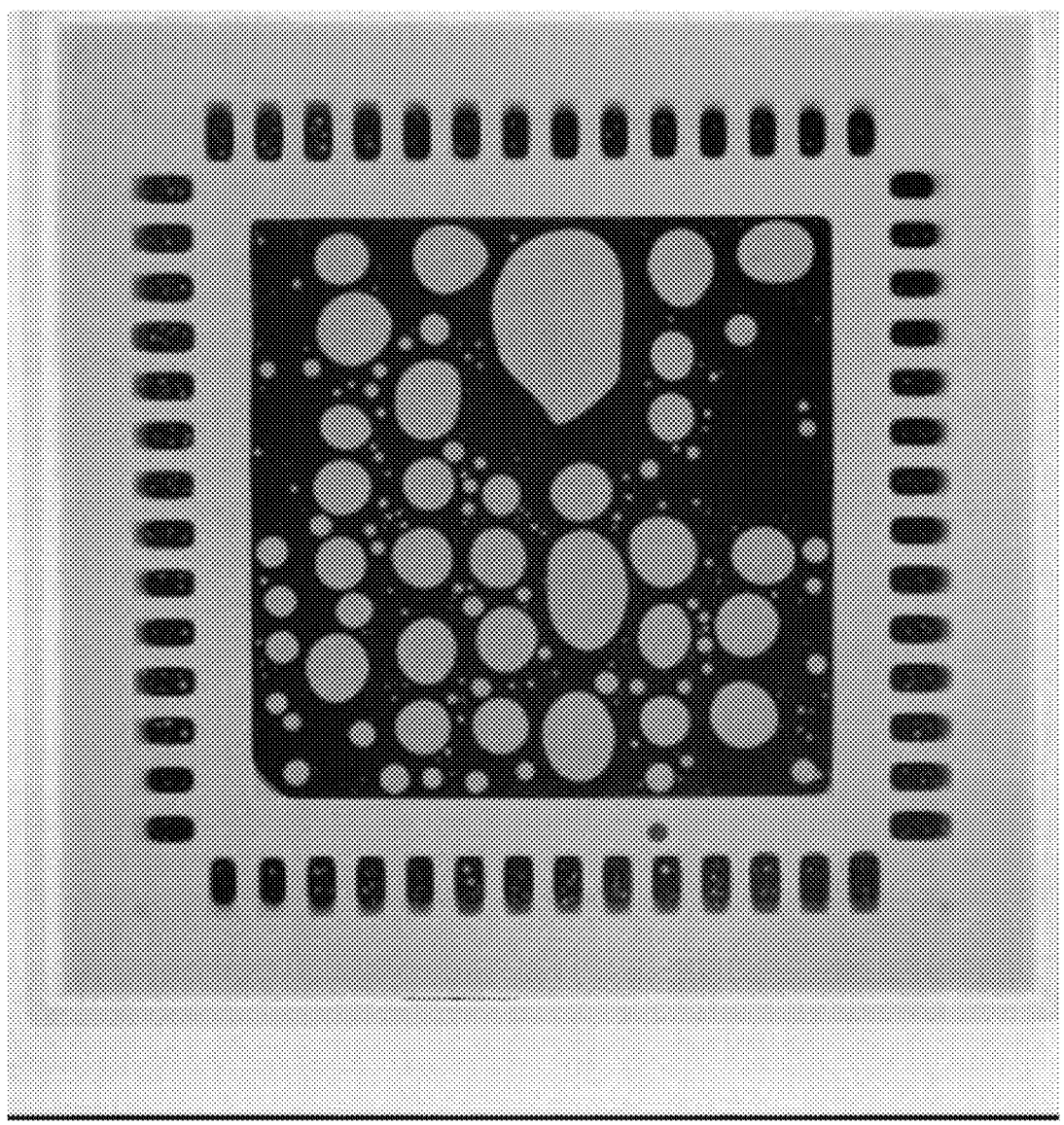
FIG. 2 is a photograph showing an image of a solder joint (QFN part) on a sample board of Comparative Example 1 observed using an X-ray inspection machine.

The solder composition was printed on a substrate using a 0.13-mm-thick metal mask with a corresponding pattern, the substrate being provided with an electrode for mounting a power transistor (size: 5.5 mm×6.5 mm, thickness: 2.3 mm, land: tinned, land area: 30 mm$^2$) and QFN (size: 6 mm×6 mm, land: tinned, land area: 36 mm$^2$). The power transistor and QFN were then set on the solder composition and subjected to the reflow process (in the atmosphere) at a preheating temperature of 150 degrees C. to 180 degrees C. for 80 seconds and at a peak temperature of 240 degrees C. for a melting time of 40 seconds, thus preparing a sample board. A solder joint on the obtained sample board was observed using an X-ray inspection machine ("NLX-5000", manufactured by NAGOYA ELECTRIC WORKS CO., LTD.). Further, a void area ratio [(void area/land area)×100] at each of the power transistor and the QFN having been subjected to the reflow process was measured. It should be noted that FIGS. 1 and 2 show images of solder joints (QFN parts) in Example 1 and Comparative 1, respectively.

Voids were then evaluated in accordance with the following criteria.
B: The void area ratio is 15% or less.
C: The void area ratio is more than 15% but at most 20%.
D: The void area ratio is more than 20%.

(2) Solder Meltability

A sample board was prepared by printing the solder composition on a substrate at a printing speed of 50 mm/sec and a printing pressure of 20N using a 0.13-mm-thick block provided with 100 of each of 0.2-mm-diameter holes, 0.22-mm-diameter holes, 0.24-mm-diameter holes, 0.26-mm-diameter holes, 0.28-mm-diameter holes, 0.3-mm-diameter holes, 0.32-mm-diameter holes, 0.34-mm-diameter holes, 0.36-mm-diameter holes, 0.38-mm-diameter holes, and 0.4-mm-diameter holes. Subsequently, the obtained sample board was subjected to the reflow process (in the atmosphere) at a preheating temperature of 150 degrees C. to 180 degrees C. for 80 seconds and at a peak temperature of 240 degrees C. for a melting time of 40 seconds. The sample board having been subjected to the reflow process was then visually observed and evaluated in terms of solder meltability in accordance with the following criteria.
A: Solder melting was found in a printed part with a diameter of 0.22 mm.
B: Solder melting was not found in the printed part with a diameter of 0.22 mm but in a printed part with a diameter of 0.24 mm.
B: Solder melting was not found in a printed part with a diameter of 0.26 mm or less but in a printed part with a diameter of 0.28 mm.

(3) Bubbles in the flux residue

A sample board including a paper phenolic base was prepared, the sample board being provided with a slit (pitch: 0.8 mm, interval: 0.4 mm). The sample board was put in a thermo-hydrostat set at a temperature of 85 degrees C. and a relative humidity of 85% and left for 12 hours for a hygroscopic treatment. Subsequently, with the use of a 0.13-mm-thick metal mask with an opening corresponding to the slit, the solder composition was printed on a copper wiring and the vicinity thereof on the sample board having been subjected to the hygroscopic treatment. The printed sample board was then subjected to the reflow process (in the atmosphere) at a preheating temperature of 150 degrees C. to 180 degrees C. for 80 seconds and at a peak temperature of 240 degrees C. for a malting time of 40 seconds. After the reflow process, the slit of the sample board was observed using a magnifier (observation range: 3 mm×0.5 mm) to evaluate bubbles in the flux residue in accordance with the following criteria.
A: The flux residue contained no bubble or contained two or less bubbles of 150 μm or less.
B: The flux residue contained three to five bubbles of 150 μm or less.
C: The flux residue contained six or more bubbles of 150 μm or less.
D: The flux residue contained bubbles larger than 150 μm.

TABLE 1

|  |  |  |  | Example |  |  |  |  |  |  | Comparative |  |  |  |  |  |
|---|---|---|---|---|---|---|---|---|---|---|---|---|---|---|---|---|
|  |  |  |  | 1 | 2 | 3 | 4 | 5 | 6 | 7 | 1 | 2 | 3 | 4 | 5 | 6 |
| Blending ratio of flux composition (mass %) | (A) | (A1) | Rosin-based resin A | 17.0 | 20.0 | 15.0 | 20.0 | 20.0 | 17.0 | 17.0 | 40.0 | 40.0 | 40.0 | 17.0 | 20.0 | 30.0 |
|  |  | (A2) | Rosin-based resin B | 17.0 | 20.0 | 25.0 | 14.0 | 20.0 | 17.0 | — | — | — | — | — | — | 5.0 |
|  |  |  | Rosin-based resin C | — | — | — | — | — | — | 17.0 | — | — | — | — | — | — |
|  |  | (A3) | Rosin-based resin D | — | — | — | — | — | — | — | — | — | — | 17.0 | 20.0 | — |
|  | (B) |  | Activator A | 2.0 | 2.0 | 2.0 | 2.0 | 2.0 | 2.0 | 2.0 | 2.0 | 2.0 | 2.0 | 2.0 | 2.0 | 2.0 |
|  |  |  | Activator B | 2.0 | 2.0 | 2.0 | 2.0 | 2.0 | 2.0 | 2.0 | 2.0 | 2.0 | 2.0 | 2.0 | 2.0 | 2.0 |
|  | (C) | (C1) | Solvent A | 10.0 | 10.0 | 10.0 | 10.0 | — | 5.0 | 10.0 | — | 10.0 | — | 10.0 | 10.0 | 10.0 |
|  |  |  | Solvent B | — | — | — | — | 10.0 | — | — | — | — | 10.0 | — | — | — |
|  |  | (C2) | Solvent C | 26.5 | 26.5 | 26.5 | 26.5 | 26.5 | 26.5 | 26.5 | 26.5 | 26.5 | 26.5 | 26.5 | 26.5 | 26.5 |
|  |  | (C3) | Solvent D | 15.5 | 9.5 | 9.5 | 15.5 | 9.5 | 20.5 | 15.5 | 19.5 | 9.5 | 9.5 | 15.5 | 9.5 | 14.5 |
|  | Other Components |  | Thixotropic agent | 6.0 | 6.0 | 6.0 | 6.0 | 6.0 | 6.0 | 6.0 | 6.0 | 6.0 | 6.0 | 6.0 | 6.0 | 6.0 |
|  |  |  | Antioxidant | 4.0 | 4.0 | 4.0 | 4.0 | 4.0 | 4.0 | 4.0 | 4.0 | 4.0 | 4.0 | 4.0 | 4.0 | 4.0 |
|  |  |  | Flux composition in total | 100.0 | 100.0 | 100.0 | 100.0 | 100.0 | 100.0 | 100.0 | 100.0 | 100.0 | 100.0 | 100.0 | 100.0 | 100.0 |
| Blending ratio of solder composition (mass %) |  |  | Flux composition | 11.0 | 11.0 | 11.0 | 11.0 | 11.0 | 11.0 | 11.0 | 11.0 | 11.0 | 11.0 | 11.0 | 11.0 | 11.0 |
|  |  |  | (D) Solder powder | 89.0 | 89.0 | 89.0 | 89.0 | 89.0 | 89.0 | 89.0 | 89.0 | 89.0 | 89.0 | 89.0 | 89.0 | 89.0 |
|  |  |  | Solder Composition in total | 100.0 | 100.0 | 100.0 | 100.0 | 100.0 | 100.0 | 100.0 | 100.0 | 100.0 | 100.0 | 100.0 | 100.0 | 100.0 |
| Evaluation Results |  |  | (1) Void | B | B | B | B | B | B | B | D | B | B | B | B | B |
|  |  |  | (2) Solder-meltability | B | A | B | A | A | B | B | B | B | B | B | B | A |
|  |  |  | (3) Bubbles in the flux residue | B | B | A | B | B | B | B | D | D | D | C | C | C |

As is clear from the results shown in Table 1, it has been found that the solder composition (Examples 1 to 7) of the exemplary embodiment provides excellent results of evaluation of void, solder meltability, and bubbles in the flux residue. Therefore, it has been found the solder composition of the exemplary embodiment can sufficiently reduce bubbles in the flux residue.

What is claimed is:

1. A solder composition comprising:
a flux composition comprising a component (A) in a form of a rosin-based resin, a component (B) in a form of an activator, and a component (C) in a form of a solvent; and
a component (D) in a form of a solder powder with a melting point in a range from 200 degrees C. to 250 degrees C., wherein
the component (A) comprises a component (A1) in a form of a rosin-based resin with a softening point of 130 degrees C. or more and an acid number of 220 mgKOH/g or more and a component (A2) in a form of a rosin-based resin with a softening point of 100 degrees C. or less and an acid number of 20 mgKOH/g or less,
the component (C) comprises a component (C1) in a form of a hexanediol solvent with a melting point of 40 degrees C. or more and a component (C2) in a form of a solvent with a viscosity of 10 mPa·s or less at 20 degrees C. and a boiling point of 270 degrees C. or more, and
a content of the component (A1) is in a range from 15 mass % to 25 mass % with respect to the flux composition being 100 mass %.

2. The solder composition according to claim 1, wherein the acid number of the component (A1) is 230 mgKOH/g or more.

3. The solder composition according to claim 1, wherein the softening point of the component (A2) is in a range from 70 degrees C. to 90 degrees C., and
the acid number of the component (A2) is in a range from 3 mgKOH/g to 15 mgKOH/g.

4. The solder composition according to claim 1, wherein the content of the component (A1) is in a range from 15 mass % to 22 mass % with respect to the flux composition being 100 mass %.

5. The solder composition according to claim 1, wherein a content of the component (A2) is in a range from 15 mass % to 30 mass % with respect to the flux composition being 100 mass %.

6. The solder composition according to claim 1, wherein a content of the component (A) is in a range from 20 mass % to 60 mass % with respect to the flux composition being 100 mass %.

7. The solder composition according to claim 1, wherein the component (B) comprises a non-dissociative activator comprising an organic acid and a non-dissociative halogenated compound.

8. The solder composition according to claim 1, wherein a content of the component (B) is in a range from 1 mass % to 20 mass % with respect to the flux composition being 100 mass %.

9. The solder composition according to claim 1, wherein the component (C1) comprises at least one selected from the group consisting of 2,5-dimethylhexane-2,5-diol and 1,6-hexanediol.

10. The solder composition according to claim 1, wherein the component (C2) comprises tetraethylene glycol dimethyl ether.

11. The solder composition according to claim 1, wherein a mass ratio (C2)/(C1) of the component (C2) to the component (C1) is in a range from 1 to 10.

12. The solder composition according to claim 1, wherein the component (C) further comprises a component (C3) in a form of at least one selected from the group consisting of diethylene glycol monohexyl ether, diethylene glycol monobutyl ether, α,β,γ-terpineol, benzyl glycol, diethylene glycol mono 2-ethylhexyl ether, tripropylene glycol, diethylene glycol monobenzyl ether, diethylene glycol dibutyl ether, tripropylene glycol monomethyl ether, dipropylene glycol monobutyl ether, ethylene glycol mono2-ethylhexyl ether, diethylene glycol monoethyl ether acetate, and 2,2-dimethyl-1,3-propanediol.

13. The solder composition according to claim 12, wherein a mass ratio (C3)/(C) of the component (C3) to the component (C) is in a range from 1/15 to 1/2.

14. The solder composition according to claim 1, wherein a content of the component (C) is in a range from 20 mass % to 65 mass % with respect to the flux composition being 100 mass %.

15. The solder composition according to claim 1, wherein the solder composition is used to connect an electronic board comprising a paper phenolic base to an electronic component.

16. The solder composition according to claim 1, wherein the solder composition is in a form of a no-wash solder composition.

17. An electronic board comprising a soldered portion where the solder composition according to claim 1 is applied.

18. The electronic board according to claim 17, wherein
an electronic component with a land area of 30 mm$^2$ or more is bonded to the electronic board through the soldered portion, and
the soldered portion has a void area ratio of 15% or less, the void area ratio being represented by (void area/land area)×100.

19. A bonding method of connecting an electronic board comprising a paper phenolic base to an electronic component using the solder composition according to claim 1.

20. The bonding method according to claim 19, wherein a land area of the electronic component is 30 mm$^2$ or more.

* * * * *